United States Patent
Sato

(10) Patent No.: US 7,875,971 B2
(45) Date of Patent: Jan. 25, 2011

(54) SEMICONDUCTOR DEVICE HAVING IMPROVED HEAT SINK

(75) Inventor: Keisuke Sato, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 4 days.

(21) Appl. No.: 12/040,989

(22) Filed: Mar. 3, 2008

(65) Prior Publication Data

US 2008/0211088 A1 Sep. 4, 2008

(30) Foreign Application Priority Data

Mar. 2, 2007 (JP) .............................. 2007-053341

(51) Int. Cl.
*H01L 23/34* (2006.01)
(52) U.S. Cl. .................. 257/707; 257/711; 257/712; 257/723; 257/724; 257/725; 257/730; 257/E23.101
(58) Field of Classification Search ................. 257/686, 257/707, 711, 712, 723–725, 730
See application file for complete search history.

(56) References Cited

U.S. PATENT DOCUMENTS

| | | | | |
|---|---|---|---|---|
| 6,506,626 | B1 * | 1/2003 | Chiu | 438/108 |
| 7,254,032 | B1 * | 8/2007 | Xue et al. | 361/719 |
| 2004/0104475 | A1 * | 6/2004 | Wang | 257/737 |
| 2006/0091530 | A1 * | 5/2006 | Wang | 257/712 |

FOREIGN PATENT DOCUMENTS

| | | | |
|---|---|---|---|
| JP | 06-224334 | A | 8/1994 |
| JP | 06291225 | * | 10/1994 |
| JP | 07-245362 | A | 9/1995 |
| JP | 2004-006967 | A | 1/2004 |
| JP | 2004-172489 | A | 6/2004 |
| JP | 2004-327558 | A | 11/2004 |
| JP | 2006-147852 | | 6/2006 |

* cited by examiner

*Primary Examiner*—Marcos D. Pizarro
*Assistant Examiner*—Eva Yan Montalvo
(74) *Attorney, Agent, or Firm*—Young & Thompson

(57) ABSTRACT

The semiconductor device includes a substrate, a first semiconductor element, a second semiconductor element, a first heat sink and a second heat sink. The first and the second semiconductor elements are provided on the substrate. The maximum power consumption of the first semiconductor element is lower than that of the second semiconductor element. The first heat sink is fixed to the first semiconductor element. The second heat sink is fixed to the second semiconductor element. The first heat sink is spaced apart from the second heat sink.

20 Claims, 14 Drawing Sheets

SEMICONDUCTOR DEVICE HAVING IMPROVED HEAT SINK

This application is based on Japanese patent application No. 2007-53,341, the content of which is incorporated hereinto by reference.

BACKGROUND

1. Technical Field

The present invention relates to a semiconductor device.

2. Related Art

Typical conventional semiconductor devices are described in, for example, Japanese Patent Laid-Open No. 2004-172, 489, Japanese Patent Laid-Open No. H07-245,362 (1995), Japanese Patent Laid-Open No. H06-224,334 (1994) and Japanese Patent Laid-Open No. 2004-6,967. In semiconductor devices described in these documents, a plurality of semiconductor elements are installed on a substrate. Further, these semiconductor elements are equipped with heat sinks adhered thereon, for the purpose of promoting an emission of heat generated in each of the semiconductor elements. Such heat sink totally covers all the semiconductor elements on the substrate.

In addition to the above-listed documents, conventional technologies related to the present invention include technologies described in Japanese Patent Laid-Open No. 2004-327,558 and Japanese Patent Laid-Open No. 2006-147,852.

However, when a heat generated from each of the semiconductor elements is different in the above-described semiconductor device, it is considered that a heat is transferred from a component that generates relatively larger heat to a component that generates relatively smaller heat through the heat sink. In such case, a thermorunaway may possibly be occurred in the component that generates relatively smaller heat.

SUMMARY

According to one aspect of the present invention, there is provided a semiconductor device, comprising: a substrate; a first semiconductor element provided on the substrate; a second semiconductor element provided on the substrate, the second semiconductor having a maximum power consumption that is smaller than a maximum power consumption of the first semiconductor element; a first heat sink fixed to the first semiconductor element; and a second heat sink fixed to the second semiconductor element, wherein the first heat sink is spaced apart from the second heat sink.

In this semiconductor device, the first semiconductor element having relatively larger maximum power consumption and the second semiconductor element having relatively smaller maximum power consumption are provided on one substrate. Thus, when a common heat sink is installed to these semiconductor elements, there is a concern that a heat may be transferred from the first semiconductor element to the second semiconductor element through such common heat sink. On the contrary, in the configuration of the present invention, the heat sink fixed to the first semiconductor element (first heat sink) is separated from the heat sink fixed to the second semiconductor element (second heat sink). This allows preventing a heat from transferring from the first semiconductor element to the second semiconductor element through the heat sink.

According to the present invention, the semiconductor device, which is capable of preventing a heat from being transferred between the semiconductor elements, can be achieved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary implementations according to the present invention will be described in reference to the annexed figures. In all figures, an identical numeral is assigned to an element commonly appeared in the figures, and the detailed description thereof will not be repeated.

First Embodiment

Figure 1:
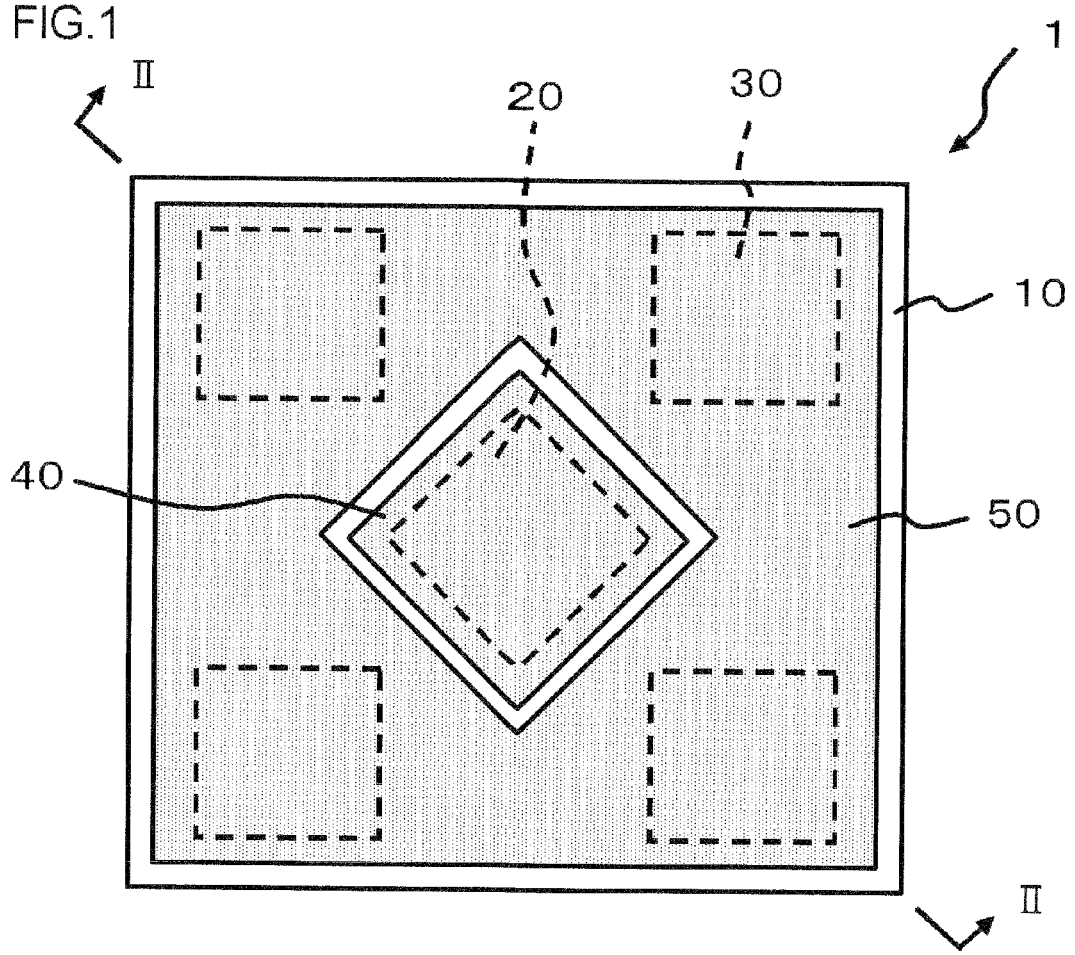
FIG. 1 is a plan view, illustrating first embodiment of a semiconductor device according to the present invention.
Figure 2:
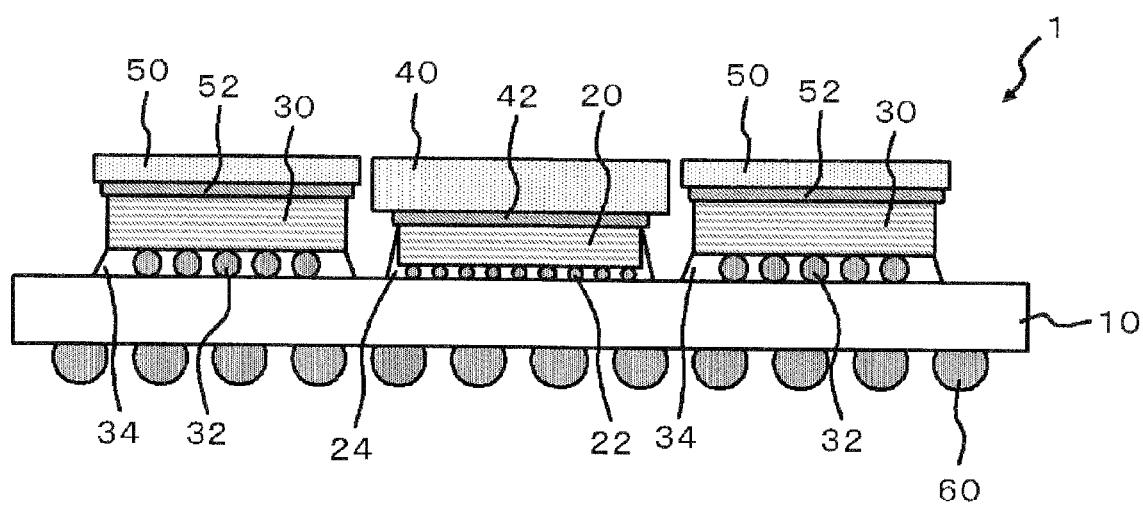
FIG. 2 is a cross-sectional view along line II-II in FIG. 1.

FIG. 1 is a plan view, illustrating a first embodiment of a semiconductor device according to the present invention. FIG. 2 is a cross-sectional view along line II-II of FIG. 1. As can be seen from these diagrams, the semiconductor device 1 is a system-in-package (SIP) semiconductor device, and includes a substrate 10, a semiconductor element 20 (first semiconductor element), semiconductor elements 30 (second semiconductor elements), a heat sink 40 (first heat sink) and a heat sink 50 (second heat sink).

The substrate 10 is, for example, a resin substrate. The substrate 10 also includes interconnects formed therein, which is not shown here. The semiconductor elements 20 and 30 are installed on such substrate 10. In the present embodiment, one semiconductor element 20 and a plurality (four) of semiconductor elements 30 are provided. More specifically, each of the semiconductor elements 30 is arranged in vicinity of each side of the semiconductor element 20 in plan view. The maximum power consumption of the semiconductor element 30 is lower than that of the semiconductor element 20. The maximum power consumption is a rated value, so it does not depend on operating condition of the semiconductor element 30.

In the present embodiment, the semiconductor elements 20 function as a logic circuit and the semiconductor elements 30 function as a memory circuit. The semiconductor element 20 is a bare chip, and on the other hand, the semiconductor element 30 is a packaged memory package. More specifically, in this specification, the term "semiconductor element" is a concept that includes both of semiconductor chips and semiconductor packages. Exemplary implementations of the logic circuit include application specific integrated circuit (ASIC), micro processing unit (MPU) memory control unit (MCU), application specific standard product (ASSP) and the like. Further, exemplary implementations of the memory circuit include dynamic random access memory (DRAM), static random access memory (SRAM), flash memory and the like.

The semiconductor element 20 includes a solder ball 22, and is connected to the substrate 10 through the solder ball 22. Further, a gap between the substrate 10 and the semiconductor element 20 is filed with an electrically insulating underfill resin 24. In other words, the semiconductor element 20 is installed on substrate 10 in a flip-chip orientation. The side surfaces of the semiconductor element 20 serving as a bare chip are covered with the underfill resin 24. Eutectic solder, for example, may be employed for solder constituting the solder ball 22.

The semiconductor element 30 includes external electrode terminals 32, and is connected to the substrate 10 via the external electrode terminals 32. A gap between the substrate 10 and the semiconductor element 30 is also filled with an electrically insulating underfill resin 34. In other words, the semiconductor element 30 is installed on substrate 10 to form a ball grid array (BGA). In addition to above, the side surfaces of the semiconductor element 30 serving as a package are not covered with the underfill resin 34. This provides the semiconductor element 30 having the side surfaces exposed to the outside. Further, the surfaces of the underfill resins 24 and 34 between the semiconductor element 20 and the semiconductor element 30 are exposed to the outside. A gap is present between the semiconductor element 20 and the semiconductor element 30. For example, eutectic solder, lead-free (Pb-free) solder or the like may be employed for a material constituting the external electrode terminal 32. Here, a height of the upper surface of semiconductor element 20 from the substrate 10 is lower than a height of the upper surface of the semiconductor element 30.

The heat sink 40 is fixed to the semiconductor element 20. More specifically, the heat sink 40 is provided through a binding material 42 on the semiconductor element 20. Similarly, the heat sink 50 is fixed to the semiconductor element 30. More specifically, the heat sink 50 is provided through a binding material 52 on the semiconductor element 30. The heat sink 40 is provided only over the semiconductor element 20, and is not provided over the semiconductor element 30. On the other hand, the heat sink 50 is provided only over the semiconductor element 30, and is not provided over the semiconductor element 20. This heat sink 50 covers a plurality of semiconductor element 30 collectively.

The heat sink 40 is spaced apart from the heat sink 50. In the present embodiment, a distance between the heat sink 40 and the heat sink 50 is substantially constant. More specifically, a rectangular opening is formed in the heat sink 50, and the heat sink 40 is arranged in this opening. A dimensional area of the opening is larger than a dimensional area of the semiconductor element 20 in plan view. This allows an arrangement of the heat sinks 40 and 50, which are arranged to be spaced apart with certain distances. Further, the heat sinks 40 and 50 has different thicknesses. More specifically, the thickness of heat sink 40 is larger than that of the heat sink 50. A height of the upper surface of the heat sink 40 from substrate 10 is equivalent to a height of the upper surface of the heat sink 50.

The heat sinks 40 and 50 are flat. Materials of the heat sinks 40 and 50 may be, for example, copper (Cu), aluminum (Al) or aluminum silicon carbide (AlSiC). Further, it is preferable to employ a material having higher thermal conductivity for the binding materials 42 and 52. The binding materials 42 and 52 may be composed of an electrically insulating binding material such as an electrically insulating resin, or an electroconductive binding material such as silver paste.

Further, the semiconductor device 1 includes external electrode terminals 60. The external electrode terminals 60 are formed on a lower surface of the substrate 10 (a side of the substrate opposite to the side having the semiconductor elements 20 and 30 installed thereon). These external electrode terminals 60 function as external electrode terminals for the semiconductor device 1.

Figure 3:
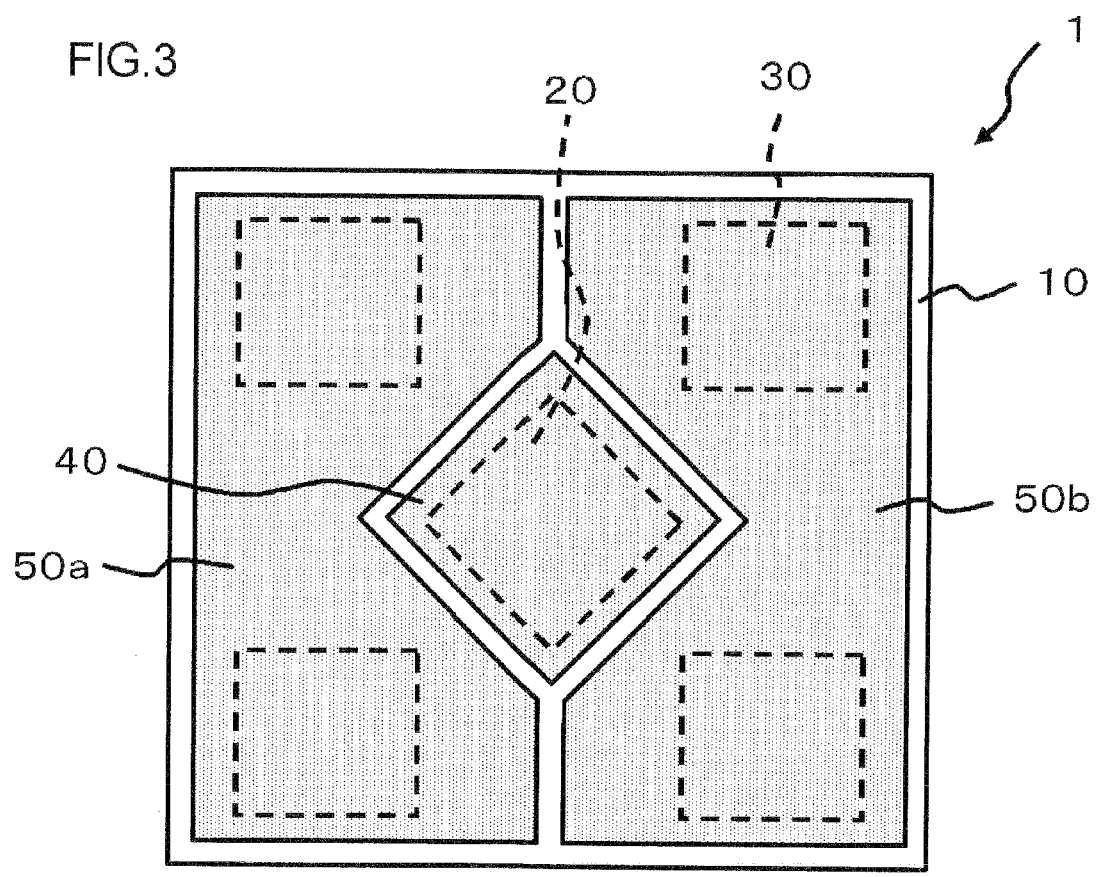
FIG. 3 is a plan view, illustrating a modified version of the embodiment according to the present invention.
Figure 4:
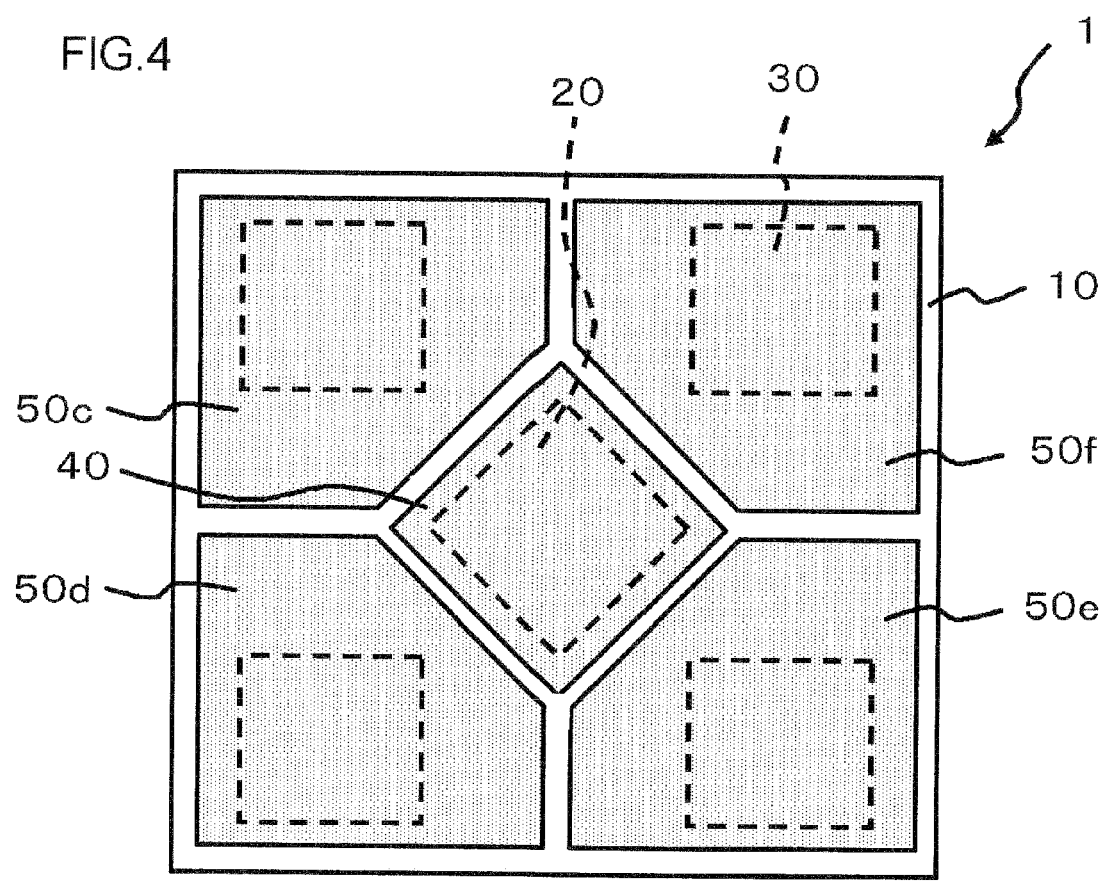
FIG. 4 is a plan view, illustrating a modified version of the embodiment according to the present invention.

In addition to above, the heat sink 50 of the present embodiment may be divided into a plurality of members, as shown in FIG. 3 and FIG. 4. FIG. 3 illustrates an exemplary implementation employing divided two heat sinks 50*a* and 50*b*, in place of employing one piece of the heat sink 50. FIG. 4 illustrates an exemplary implementation employing divided four heat sinks 50*c*, 50*d*, 50*e* and 50*f*, in place of employing one piece of the heat sink 50.

Subsequently, advantageous effects of semiconductor device 1 will be described. In this semiconductor device 1, the semiconductor element 20 having relatively larger maximum power consumption and the semiconductor element 30 having relatively smaller maximum power consumption are provided on one substrate 10. Thus, when a common heat sink is installed to these semiconductor elements 20 and 30, there is a concern that a heat may be transferred from the semiconductor element 20 to the semiconductor element 30 through such common heat sink. Such heat transfer is considerably caused when a difference in the maximum power consumption between the semiconductor elements 20 and 30 is equal to or higher than 3 W. On the contrary, in the present embodiment, the heat sink 40 fixed to the semiconductor element 20 is separated from the heat sink 50 fixed to the semiconductor element 30. This configuration allows preventing a heat from being transferred from the semiconductor element 20 to the semiconductor element 30 through the heat sink.

Meanwhile, a heat transfer between the semiconductor element 20 and the semiconductor element 30 may also be occurred through other heat path except the heat sink. For example, when the semiconductor elements 20 and 30 are covered with an encapsulating resin, a heat transfer is occurred through the encapsulating resin. On the contrary, since the gap is present between the semiconductor element 20 and the semiconductor element 30 in the present embodiment, a heat transfer through the encapsulating resin can be prevented.

The height of the upper surface of the semiconductor element 20 from the substrate 10 is lower than the height of the upper surface of the semiconductor element 30. When the level of the upper surfaces of the semiconductor elements 20 and 30 are not the same in this way, an additional approach for protruding a portion of the heat sink or the like may be required, if a common heat sink, which totally covers these upper surfaces, is provided. More specifically, a provision for protruding a section of the heat sink that faces the semiconductor element 20 by a distance equivalent to a difference in the level between the upper surface of the semiconductor element 20 and the upper surface of the semiconductor element 30, should be conducted. Hence, a problem of an increased manufacturing cost may be occurred. On the contrary, since the individual heat sinks 40 and 50 are provided for the semiconductor elements 20 and 30 having different height of the upper surface in the present embodiment, such problem can be avoided.

The heat sinks 40 and 50 has different thicknesses. This allows providing the coplanar upper surfaces of the heat sinks 40 and 50, even if the upper surfaces of the semiconductor elements 20 and 30 are not coplanar. Actually, the upper surfaces of the heat sinks 40 and 50 are coplanar in the semiconductor device 1 as described above (see FIG. 2). As such, the coplanar upper surfaces of the heat sinks 40 and 50 helps a common heat sink to be further installed on the heat sinks 40 and 50.

The semiconductor elements 20 function as a logic circuit and the semiconductor elements 30 function as a memory circuit. In general, the memory circuit generates a heat, which is smaller than a heat generated by the logic circuit. Therefore, the semiconductor device 1, which is capable of preventing a heat generated by the logic circuit from being transferred to the memory circuit through the heat sink, is particularly useful.

When Cu, Al or AlSiC is employed for the materials of the heat sinks 40 and 50, the heat sinks 40 and 50 exhibiting improved heat-release-abilities can be obtained. Among Cu, Al and AlSiC, Cu provides particularly improved heat-release-ability, process-ability and reduced production cost. On the contrary, AlSiC provides particularly reduced weight.

Since the heat sinks 40 and 50 are flat, the manufactures thereof are simpler than the manufacture of heat sinks having uneven thickness. Since such heat sinks 40 and 50 can be manufactured by, for example, a stamping process, these heat sinks can be manufactured at lower production cost.

All the semiconductor elements 20 and 30 on the substrate 10 are covered with the heat sink (heat sink 40 or heat sink 50). This allows preventing the semiconductor elements 20 and 30 from being chipped or broken during handling the package (semiconductor device 1). Further, since the heat sink is provided over substantially the whole package, an amount of warpage of the package can be reduced.

Figure 5:
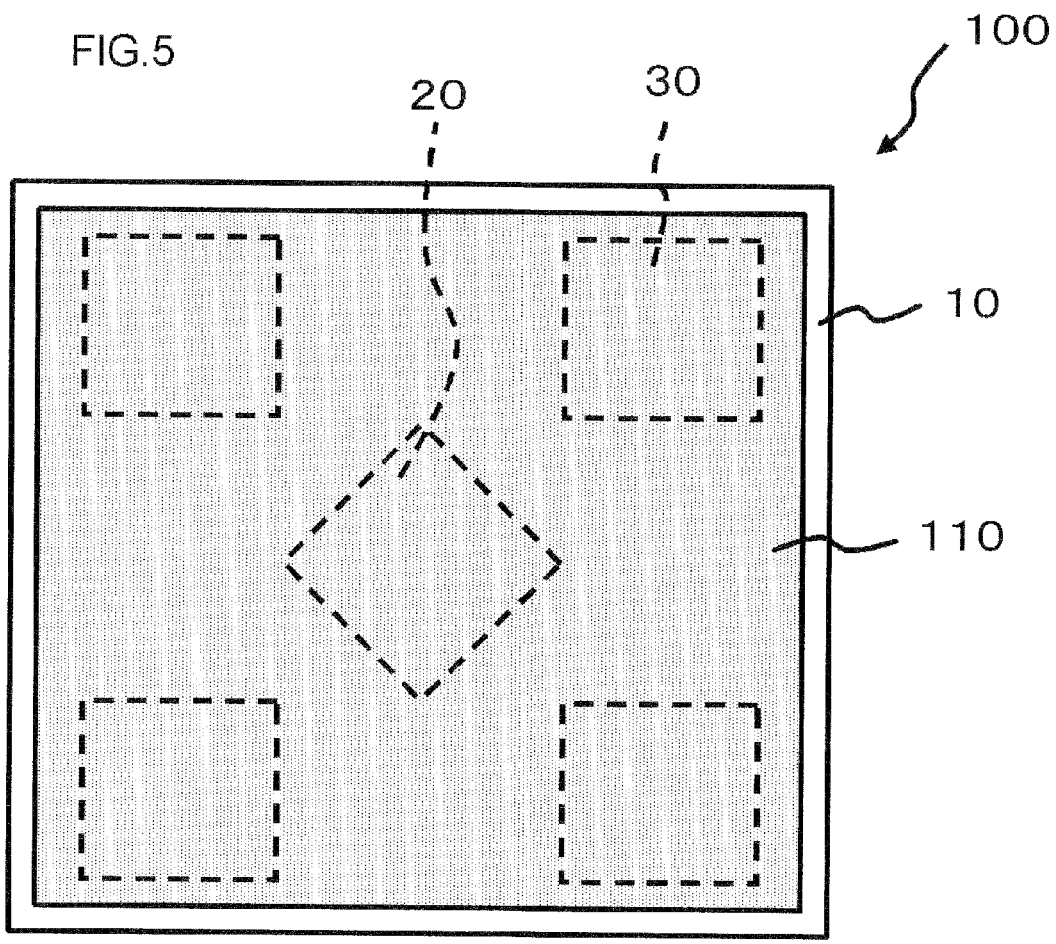
FIG. 5 is a plan view, illustrating a semiconductor device according to a comparative example.

FIG. 5 is a plan view, illustrating a semiconductor device according to a comparative example. In a semiconductor device 100, semiconductor elements 20 and 30 are totally covered with one heat sink 110.

Table 1 and Table 2 show results of thermal analysis conducted for the semiconductor device 1 according to the embodiment and the semiconductor device 100 according to comparative example. However, the semiconductor device 1 employed here includes two heat sinks (see FIG. 3), in place of one piece of the heat sink 50. In this thermal analysis, the semiconductor element 20 employed here was an ASIC chip (maximum power consumption: 10 W), and the semiconductor element 30 employed here was a memory package (maximum power consumption: 1.86 W). The materials of the heat sinks 40, 50 and 110 were Cu. The ambient air temperature was set to be 25 degree C.

Table 1 shows results in the case of air stream velocity of 0 m/s, and Table 2 shows results in the case of air stream velocity of 1 m/s. "ASIC" and "Memory" in these tables indicate temperatures (degree C.) of the semiconductor element 20 and the semiconductor element 30, respectively.

Further, "heat sink (1)" and "heat sink (2)" in these tables indicate temperatures (degree C.) of the heat sink 40 and the heat sink 50, respectively. However, in comparative example, "heat sink (1)" and "heat sink (2)" indicate temperatures (degree C.) of the heat sink 110 immediately above the semiconductor element 20 and the semiconductor element 30, respectively.

TABLE 1

|  | ASIC | HEAT SINK (1) | MEMORY | HEAT SINK (2) |
|---|---|---|---|---|
| COMPARATIVE EXAMPLE | 122.2 | 113.8 | 111.6 | 110.9 |
| EMBODIMENT | 149.7 | 149.2 | 108.0 | 105.5 |

TABLE 2

|  | ASIC | HEAT SINK (1) | MEMORY | HEAT SINK (2) |
|---|---|---|---|---|
| COMPARATIVE EXAMPLE | 98.6 | 89.8 | 88.4 | 87.2 |
| EMBODIMENT | 127.3 | 126.8 | 85.9 | 83.4 |

By focusing attention on the temperature of the semiconductor element 30 (Memory), temperature in embodiment is lower than temperature of comparative example in any of table 1 and 2. This is an evidence for the fact that a heat transfer from the semiconductor element 20 to the semiconductor element 30 is inhibited in embodiment.

Further, by comparing the results in table 1 with the results in table 2, temperature is considerably reduced in any items in the case of the air stream velocity of 1 m/s, as compared with the case of the air stream velocity of 0 m/s. It is understood from the fact that a heat-releasing effect by the air stream is considerable, even if the air stream velocity is very low as 1 m/s. A large factor for obtaining such heat-releasing effect is that a gap is present between the semiconductor elements 20 and 30. If the semiconductor elements 20 and 30 are covered with an encapsulating resin, an air stream is blocked by the encapsulating resin, so that a heat-releasing effect by the air stream cannot be sufficiently achieved.

Second Embodiment

Figure 6:
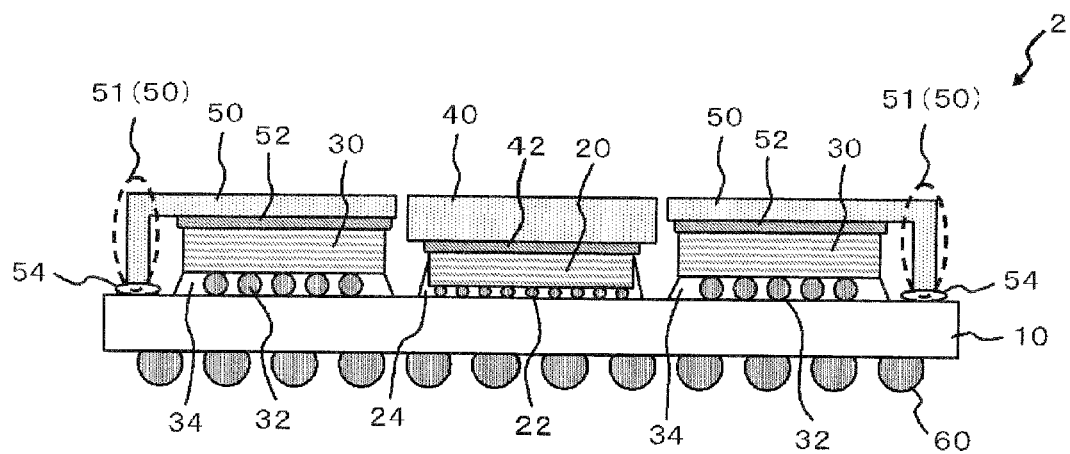
FIG. 6 is a cross-sectional view, illustrating second embodiment of a semiconductor device according to the present invention.

FIG. 6 is a cross-sectional view, illustrating second embodiment of a semiconductor device according to the present invention. The cross-sectional view represents a cross section similar as the cross-sectional view of FIG. 2. In a semiconductor device 2, the end portion 51 of the heat sink 50 is bent toward the substrate 10. A heat sink 50, in turn, is connected to the substrate 10 at such end portion 51. This coupling is achieved through a binding material 54. The end portion 51 bent toward the substrate 10 is located in the position closer to the circumference of the substrate 10, as compared with the semiconductor elements 20 and 30. More specifically, the end portion 51 is located between the semiconductor element 30 and the circumference of the substrate 10. In other words, among the end portions of the heat sink 50, only the end portion 51 located between the semiconductor element 30 and the circumference of the substrate 10 is bent toward the substrate 10. Other configuration of the semiconductor device 2 is similar to that of the semiconductor device 1.

Since the heat sink 50 is connected to the substrate 10 according to the present embodiment, a heat transferred to the heat sink 50 can also be released to the substrate 10. This allows providing an improved heat-releasing efficiency of the heat sink 50. Further, the connection of the heat sink 50 to the substrate 10 also contributes a reduction in the level of warpage of the substrate 10. Further, the end portion 51 is located between the semiconductor element 30 and the circumference of the substrate 10. On the contrary, if the end portion 51 is located between the semiconductor element 30 and the semiconductor element 20, it is necessary to provide an increased distance between the semiconductor elements 20 and 30 by the dimension of the end portion 51. This cause an increased dimensional area of the regions for installing elements on the substrate 10, and eventually an increased dimensional area of the semiconductor device 2. Since no end portion 51 is present between the semiconductor elements 20 and 30 in the present embodiment, such problem can be avoided. Other advantageous effects of the semiconductor device 2 is similar to that of the semiconductor device 1.

Concerning the heat sinks 40 and 50, the exemplary implementation, in which only the heat sink 50 has the end portion that is bent toward the substrate, is shown in FIG. 6. Alternatively, concerning the heat sinks 40 and 50, only the heat sink 40 may have an end portion that is bent toward the substrate. Alternatively, both of the heat sinks 40 and 50 may include end portions bent toward the substrate.

Figure 7:
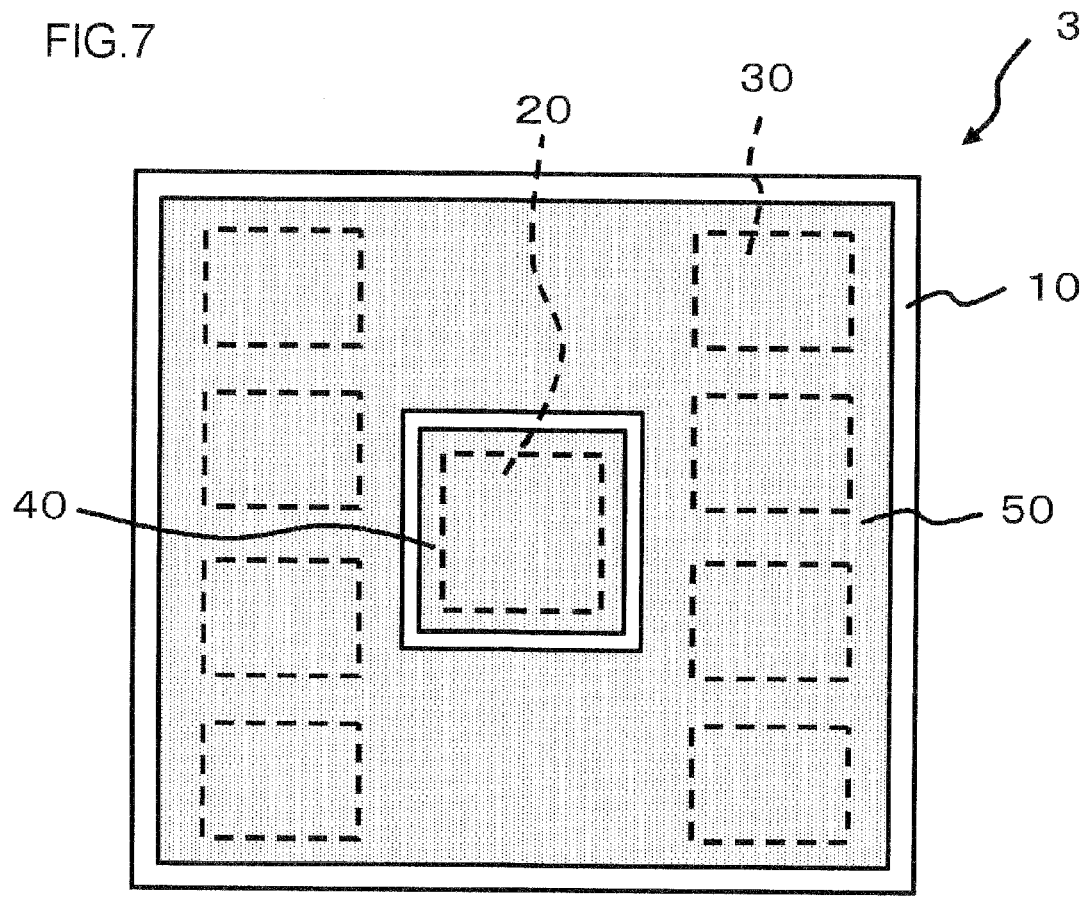
FIG. 7 is a plan view, illustrating a modified version of the embodiment according to the present invention.
Figure 8:
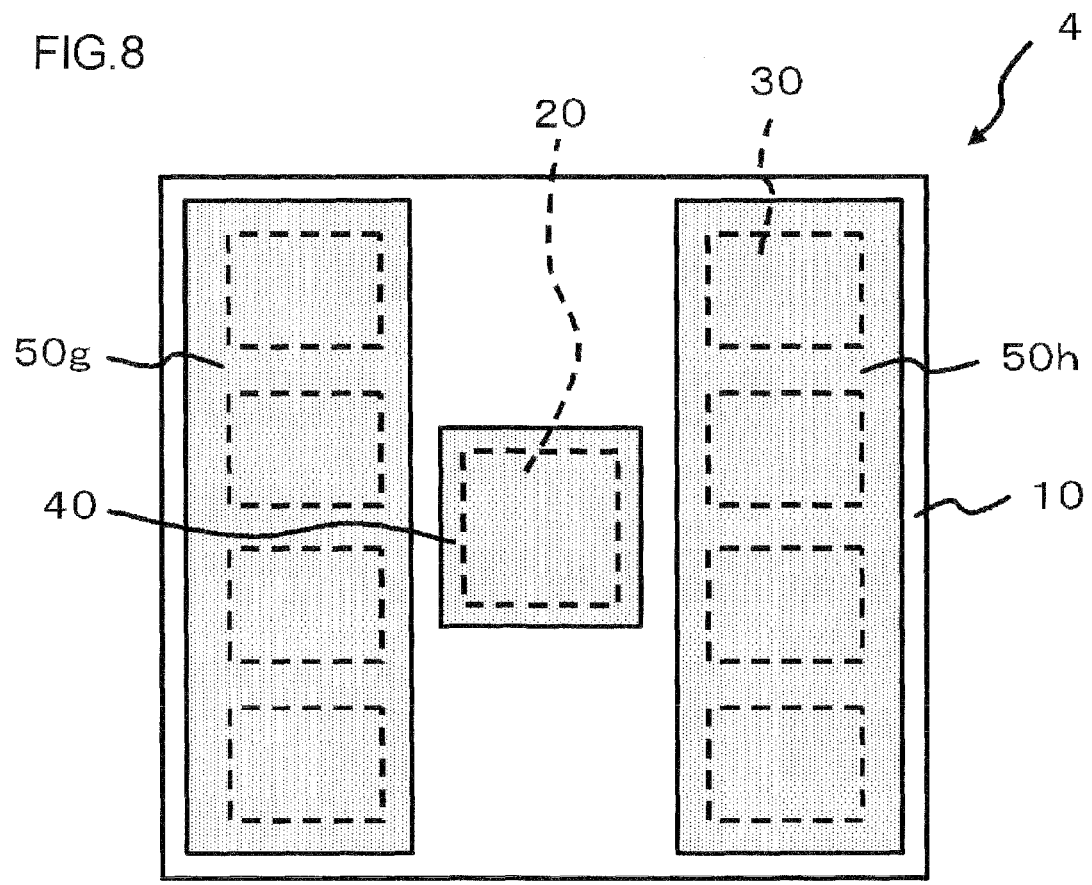
FIG. 8 is a plan view, illustrating a modified version of the embodiment according to the present invention.

The present invention is not limited to the above-described embodiments, and various modifications thereof may also be included. The arrangements of the semiconductor elements 20 and 30 and the corresponding geometries of the heat sinks 40 and 50 are not limited to those exemplified in the above-described embodiment, and various types of modifications are also available. For example, in FIG. 7 and FIG. 8, four semiconductor elements 30 are arranged in one side of the semiconductor element 20, and additional four semiconductor elements 30 are also arranged in other end opposite thereto. In the semiconductor device 3 of FIG. 7, all the semiconductor elements 30 are totally covered with one piece of the heat sink 50. On the other hand, in the semiconductor device 4 of FIG. 8, two separate heat sinks 50g and 50h are employed, in place of employing one piece of the heat sink 50.

Figure 9:
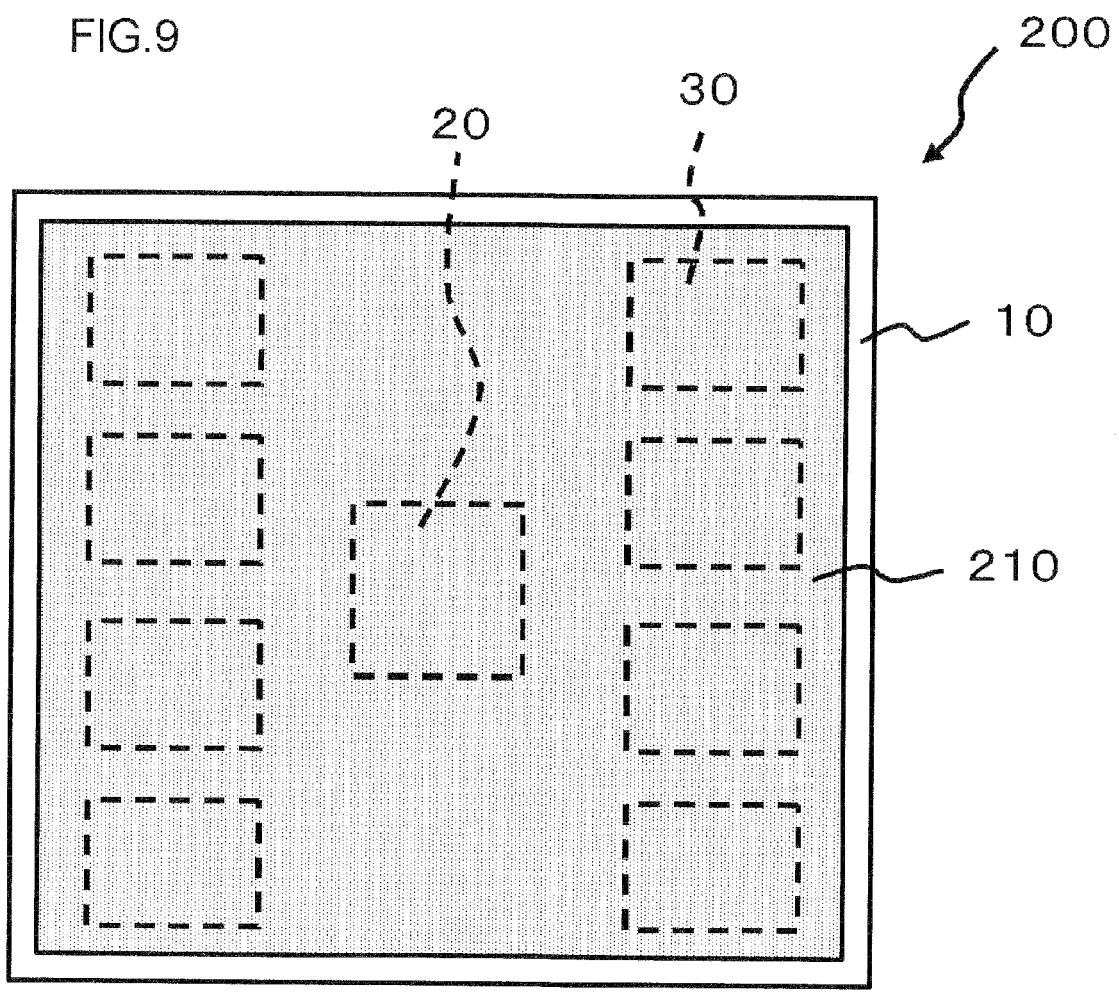
FIG. 9 is a plan view, illustrating a semiconductor device according to a comparative example.
Figure 10:
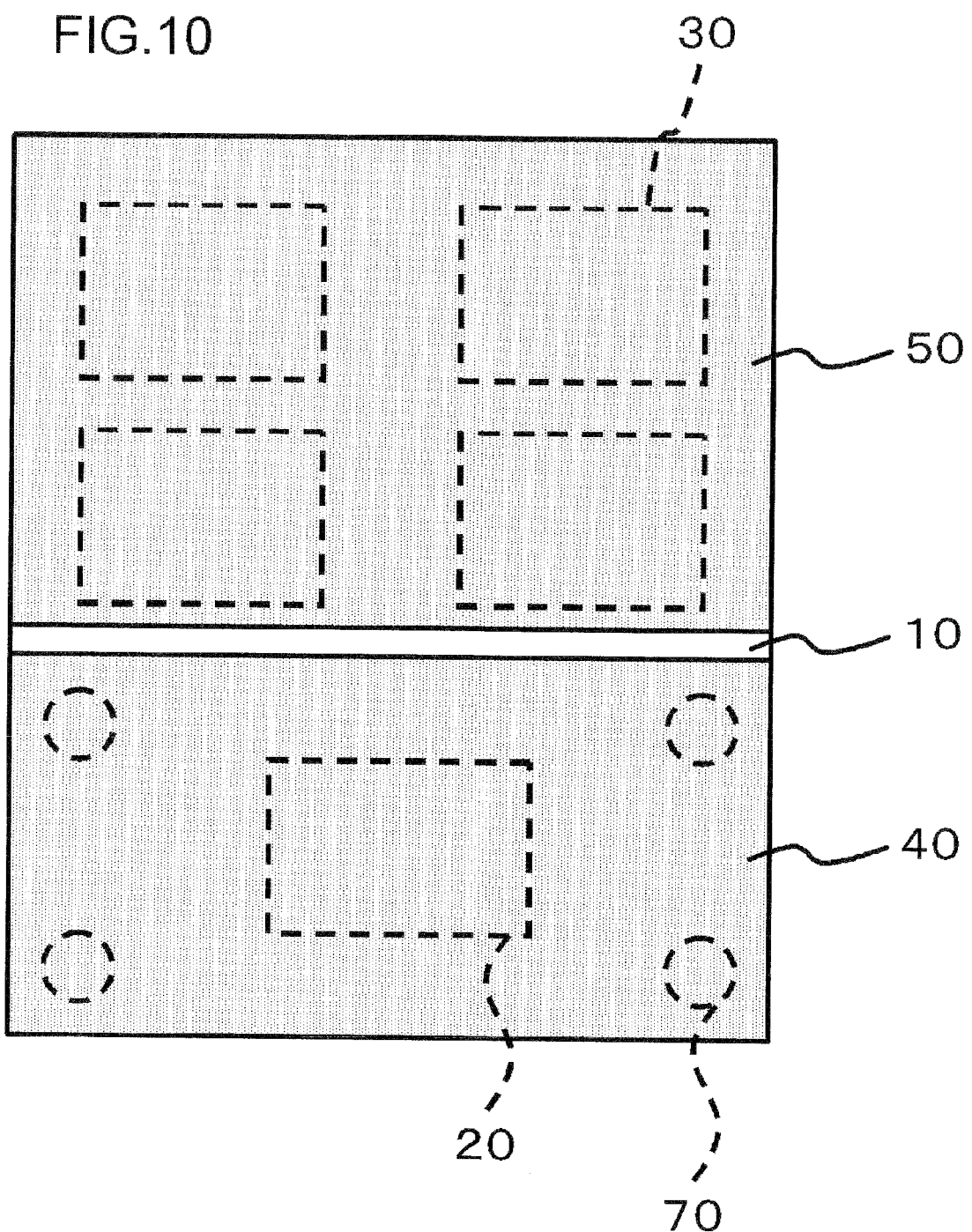
FIG. 10 is a plan view, illustrating a modified version of the embodiment according to the present invention.
Figure 11:
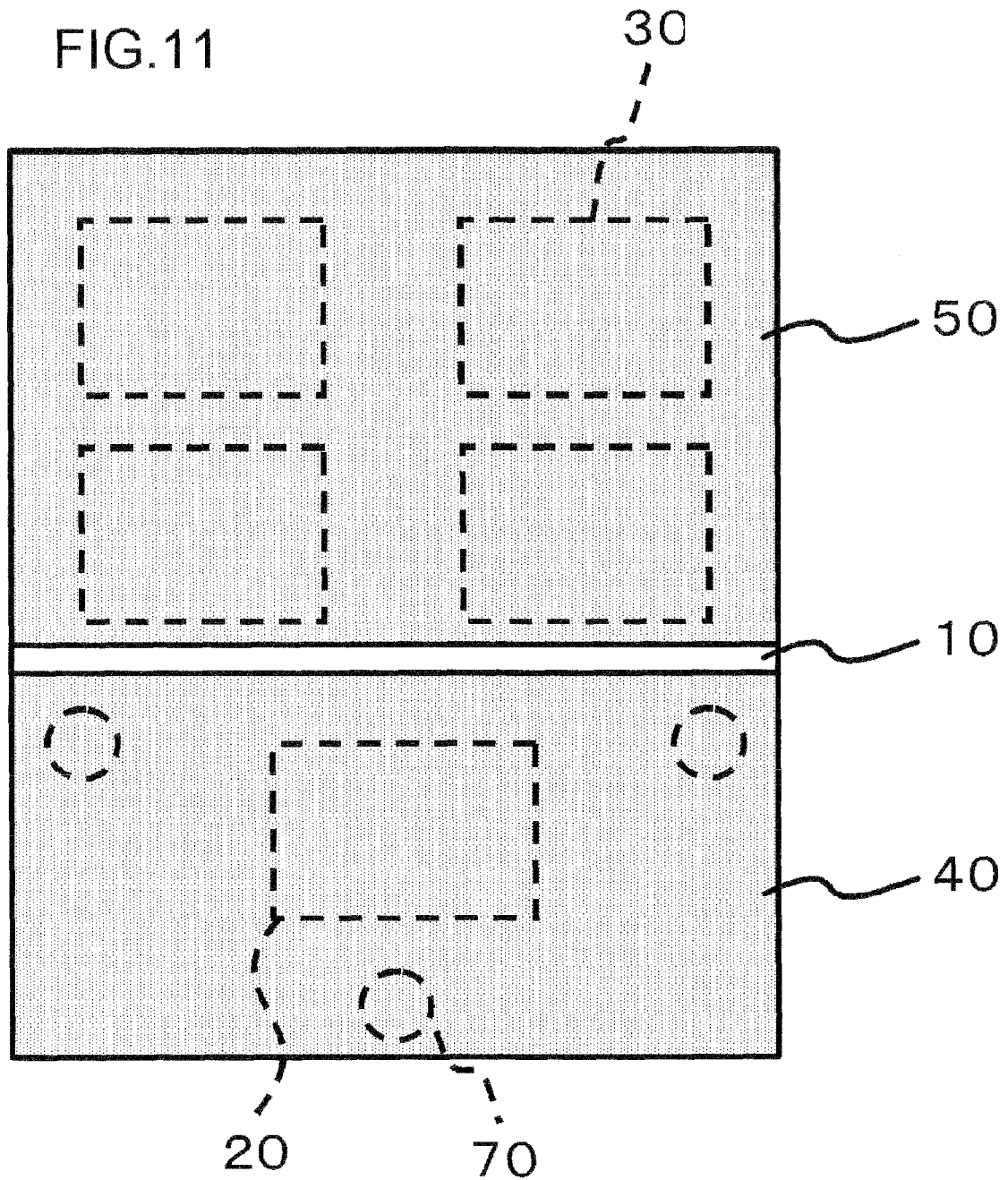
FIG. 11 is a plan view illustrating a modified version of the embodiment according to the present invention.
Figure 12:
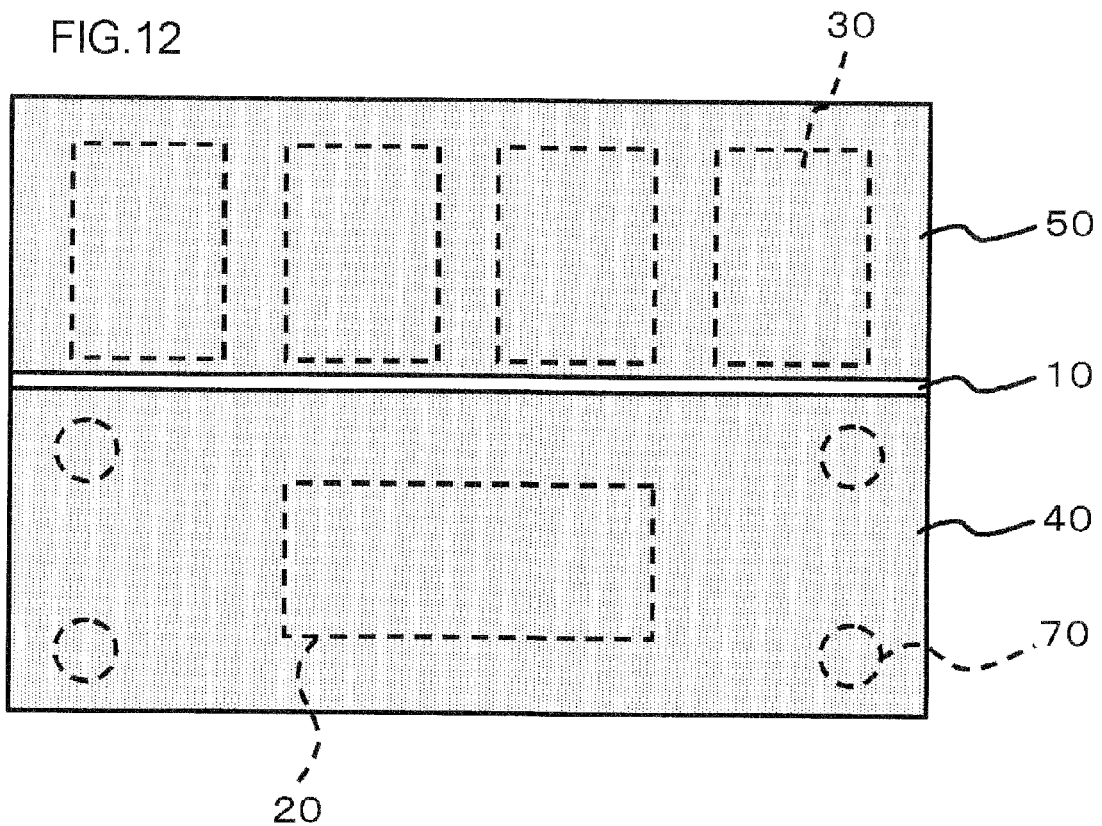
FIG. 12 is a plan view illustrating a modified version of the embodiment according to the present invention.
Figure 13:
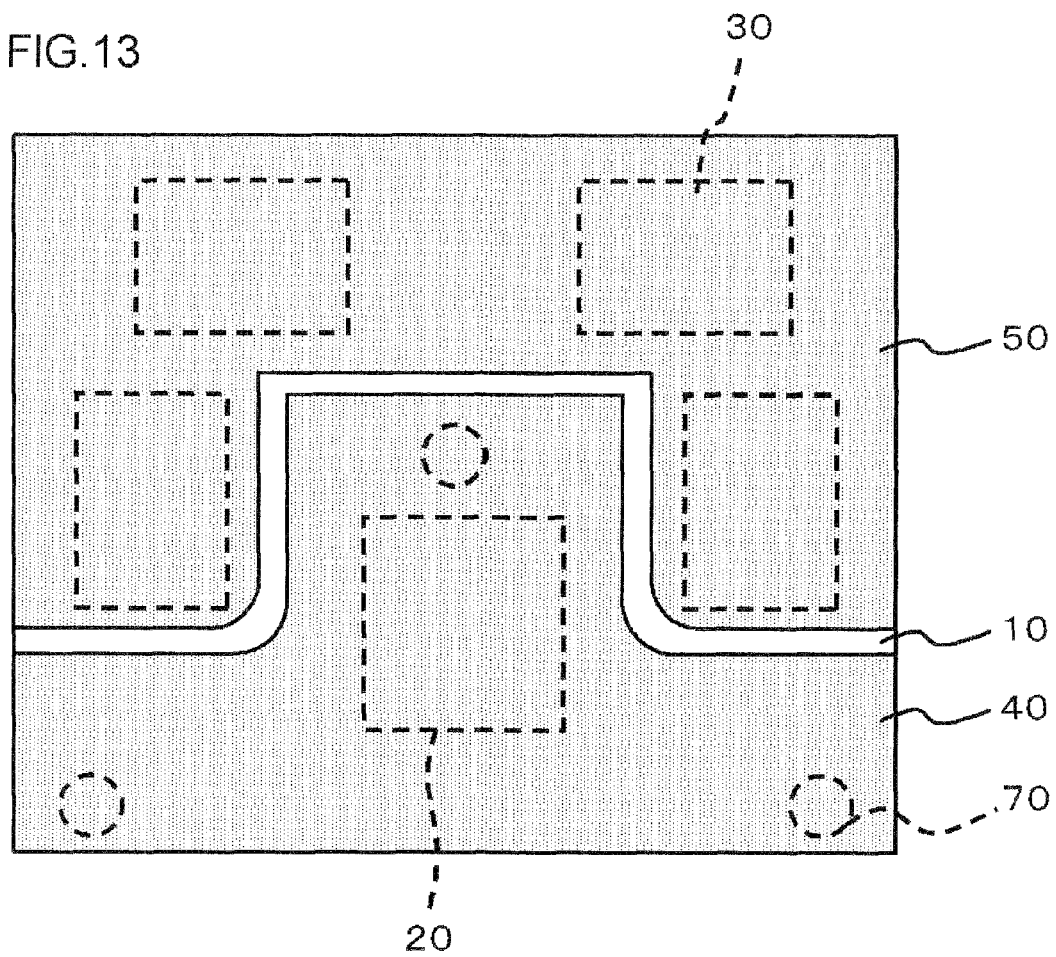
FIG. 13 is a plan view illustrating a modified version of the embodiment according to the present invention.

FIG. 9 is a plan view, illustrating a semiconductor device according to comparative example. In the semiconductor device 200, the semiconductor elements 20 and 30 are totally covered with one piece of the heat sink 210.

Table 3 and Table 4 show results of thermal analysis conducted for the semiconductor devices 3 and 4 according to the embodiment and the semiconductor device 200 according to comparative example. In this thermal analysis, the semiconductor element 20 employed here was an ASIC chip (maximum power consumption: 10 W), and the semiconductor element 30 employed here was a memory package (maximum power consumption: 1.33 W). The materials of the heat sinks 40, 50 and 210 were Cu. The ambient air temperature was set to be 25 degree C.

Table 3 shows results in the case of air stream velocity of 0 m/s, and Table 4 shows results in the case of air stream velocity of 1 m/s. Indications "embodiment (1)" and "embodiment (2)" correspond to the semiconductor device 3 and the semiconductor device 4, respectively. Meaning of other items in the tables are as described above for Tables 1 and 2.

TABLE 3

|  | ASIC | HEAT SINK (1) | MEMORY | HEAT SINK (2) |
|---|---|---|---|---|
| COMPARATIVE EXAMPLE | 124.0 | 114.6 | 112.0 | 114.6 |
| EMBODIMENT(1) | 153.4 | 146.0 | 105.9 | 103.3 |
| EMBODIMENT(2) | 154.2 | 153.6 | 109.3 | 107.1 |

TABLE 4

|  | ASIC | HEAT SINK (1) | MEMORY | HEAT SINK (2) |
|---|---|---|---|---|
| COMPARATIVE EXAMPLE | 98.9 | 89.3 | 87.4 | 86.5 |
| EMBODIMENT(1) | 128.4 | 102.6 | 80.9 | 78.2 |
| EMBODIMENT(2) | 129.0 | 128.5 | 84.6 | 82.2 |

From these results, it can be understood that a heat transfer from the semiconductor element 20 to the semiconductor element 30 is inhibited in embodiments according to the present invention. Further, when the "embodiment (1)" is compared with the "embodiment (2)" in the temperature of the semiconductor element 30 (Memory), the temperature of the former is lower than that of the latter. It is found from the results that it is more preferable to employ the single piece heat sink 50 that covers the semiconductor element 30 (see FIG. 7) than employing separated heat sinks that cover the semiconductor element 30 (see FIG. 8), in view of reducing the temperature of the semiconductor element 30. This is because the total area of the single piece heat sink 50 that covers the semiconductor element 30 (equivalent to dimensional area of the heat sink 50 in FIG. 7) is larger than the total area of the separated heat sinks that cover the semiconductor element 30 (equivalent to total dimensional area of heat sinks 50h and 50g in FIG. 8), leading to an increased heat-releasing efficiency.

The arrangement of the semiconductor elements 20 and 30 may be that shown in FIG. 10 to FIG. 13. In FIG. 10 to FIG. 13, resin posts 70 are provided. One end of the resin post 70 is connected to the substrate 10, and the other end is connected to the heat sink 40. A silicon resin, for example, may be employed for the material of the resin post 70.

Figure 14:
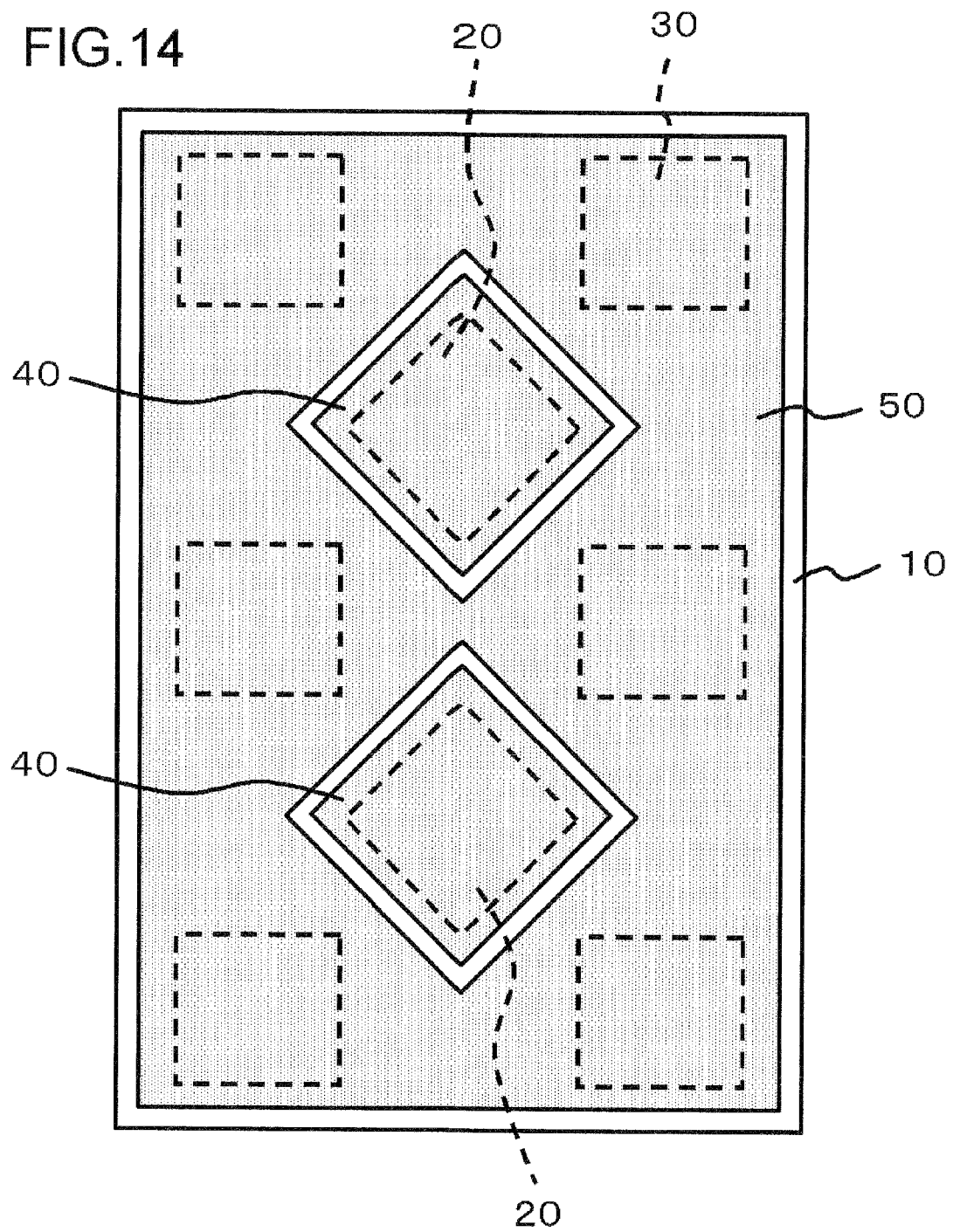
FIG. 14 is a plan view illustrating a modified version of the embodiment according to the present invention.

The exemplary implementation having one semiconductor element 20 and a plurality of semiconductor elements 30 is illustrated in the above-described embodiments. Alternatively, a combination of one semiconductor element 20 and one semiconductor element 30 may be employed, or a combination of a plurality of semiconductor elements 20 and a plurality of semiconductor elements 30 may also be employed. FIG. 14 illustrates a configuration, in which two semiconductor elements 20 and six semiconductor elements 30 are installed on the substrate 10.

The exemplary implementation, in which one of the the semiconductor elements 20 and 30 is a bare chip and the other is packaged, is illustrated in the above-described embodiments. Alternatively, both of the semiconductor elements 20 and 30, or may be bare chips, or may be packaged.

The exemplary implementation, in which the heights of the upper surfaces of semiconductor elements 20 and 30 are different, is illustrated in the above-described embodiments. Alternatively, the heights of the upper surface of semiconductor elements 20 and 30 may be the same.

It is apparent that the present invention is not limited to the above embodiment, and may be modified and changed without departing from the scope and spirit of the invention.

What is claimed is:

1. A semiconductor device, comprising:
    a substrate;
    a first semiconductor element provided on said substrate;
    a second semiconductor element provided on said substrate, said second semiconductor element having a maximum power consumption that is smaller than a maximum power consumption of said first semiconductor element;
    a first heat sink fixed to said first semiconductor element; and
    a second heat sink fixed to said second semiconductor element,
    wherein said first heat sink is disposed within an opening of said second heat sink and is spaced apart from said second heat sink.

2. The semiconductor device as set forth in claim 1, wherein a gap is included between said first semiconductor element and said second semiconductor element.

3. The semiconductor device as set forth in claim 1, wherein said first semiconductor element and said second semiconductor element have underfill resins filling within gaps with said substrate, respectively, and wherein surfaces of said underfill resins disposed between said first semiconductor element and said second semiconductor element are exposed to the outside thereof.

4. The semiconductor device as set forth in claim 1, wherein a height of an upper surface of said first semiconductor element from said substrate is lower than a height of an upper surface of said second semiconductor element from said substrate.

5. The semiconductor device as set forth in claim 4, wherein a thickness of said first heat sink is different from a thickness of said second heat sink.

6. The semiconductor device as set forth in claim 5, wherein a height of the upper surface of said first heat sink from said substrate is the same as a height of the upper surface of said second heat sink from said substrate.

7. The semiconductor device as set forth in claim 1, wherein said first semiconductor element functions as a logic circuit and said second semiconductor element functions as a memory circuit.

8. The semiconductor device as set forth in claim 7, wherein said first semiconductor element is a bare chip, and said second semiconductor element is packaged.

9. The semiconductor device as set forth in claim 1, wherein said first semiconductor element is a bare chip, and said second semiconductor element is packaged.

10. The semiconductor device as set forth in claim 1, wherein said the first and said second heat sinks are flat-shaped.

11. The semiconductor device as set forth in claim 1, wherein said first heat sink or said second heat sink has an end portion, which is bent toward said substrate, and is connected to said substrate at said end portion.

12. The semiconductor device as set forth in claim 11, wherein said end portion, which is bent toward said substrate, is disposed in a position, which is closer to a circumference of said substrate than said first semiconductor element and said second semiconductor element.

13. The semiconductor device as set forth in claim 1, wherein a plurality of said second semiconductor elements are provided on said substrate, and said second heat sink totally covers said plurality of said second semiconductor elements.

14. The semiconductor device as set forth in claim 1, wherein a dimensional area of said opening is larger than a dimensional area of said first semiconductor element.

15. The semiconductor device as set forth in claim 14, wherein said opening is disposed within a central region of said second heat sink.

16. A semiconductor device, comprising:
    a substrate;
    a first semiconductor element provided on said substrate;
    a plurality of second semiconductor elements provided on said substrate, each of said second semiconductor element having a maximum power consumption that is smaller than a maximum power consumption of said first semiconductor element;
    a first heat sink fixed to said first semiconductor element; and
    a second heat sink commonly fixed to each of said second semiconductor elements,
    wherein said first heat sink is spaced apart from said second heat sink.

17. The semiconductor device as set forth in claim 16, wherein said second heat sink includes an opening and said first heat sink is arranged in said opening.

18. The semiconductor device as set forth in claim 17, wherein a dimensional area of said opening is larger than a dimensional area of said first semiconductor element.

19. The semiconductor device as set forth in claim 17, wherein said opening is disposed within a central region of said second heat sink.

20. The semiconductor device as set forth in claim 16, wherein said first semiconductor element and said plurality of second semiconductor elements are disposed on a same side of said substrate.

* * * * *